(12) United States Patent
Chen et al.

(10) Patent No.: US 7,247,419 B2
(45) Date of Patent: Jul. 24, 2007

(54) NANOCOMPOSITE PHOTOSENSITIVE COMPOSITION AND USE THEREOF

(75) Inventors: Chunwei Chen, Piscataway, NJ (US); Ping-Hung Lu, Bridgewater, NJ (US); Hong Zhuang, Raritan, NJ (US); Mark Neisser, Whitehouse Station, NJ (US)

(73) Assignee: AZ Electronic Materials USA Corp., Somerville, NJ (US)

( * ) Notice: Subject to any disclaimer, the term of this patent is extended or adjusted under 35 U.S.C. 154(b) by 0 days.

(21) Appl. No.: 11/103,134

(22) Filed: Apr. 11, 2005

(65) Prior Publication Data

US 2006/0228645 A1 Oct. 12, 2006

(51) Int. Cl.
*G03C 1/00* (2006.01)
*G03F 7/004* (2006.01)

(52) U.S. Cl. .............. 430/281.1; 430/270.1; 430/286.1; 430/287.1; 430/905

(58) Field of Classification Search ............... None
See application file for complete search history.

(56) References Cited

U.S. PATENT DOCUMENTS

| | | | |
|---|---|---|---|
| 4,336,319 A | 6/1982 | Nagashima et al. | |
| 5,994,023 A | 11/1999 | Van Damme et al. | |
| 6,159,656 A | 12/2000 | Kawabe et al. | |
| 6,183,935 B1 | 2/2001 | Hanabata et al. | |
| 6,534,235 B1 | 3/2003 | Habanata et al. | |
| 6,642,295 B2 * | 11/2003 | Border et al. | 524/437 |
| 6,653,043 B1 | 11/2003 | Hanabata | |
| 6,783,914 B1 | 8/2004 | Fedynyshyn | |
| 6,852,465 B2 | 2/2005 | Dammel et al. | |
| 2003/0099897 A1 | 5/2003 | Fedynyshyn | |
| 2004/0175653 A1 | 9/2004 | Zuang et al. | |

FOREIGN PATENT DOCUMENTS

| | | |
|---|---|---|
| JP | 11-338144 | 12/1999 |
| WO | 2004053593 | 12/2003 |
| WO | WO 2004/053593 A2 | 6/2004 |
| WO | WO 2004/053593 A3 | 10/2004 |

OTHER PUBLICATIONS

English Language Abstract of JP 11-338144.
Invitation to Pay Additional Fees from the International Searching Authority in PCT application PCT/IB2006/000738 corresponding to the above captioned application.
Invitation to Pay Additional Fees from the International Searching Authority in PCT application PCT/IB2006/001127 corresponding to related case U.S. Appl. No. 11/103,093.
Derwent Abstract of JP 11-33814, May 1998.
International Search Report to corresponding PCT application to Ser. No. 11/103,134, Oct. 2006.
Written Opinion issued in corresponding PCT application to Ser. No. 11/103,134, Oct. 2006.
International Search Report in PCT application of related case USSN 11/103,093, Oct. 2006.
Written Opinion in PCT appplication of related case USSN 11/103,093, Oct. 2006.

* cited by examiner

*Primary Examiner*—Rosemary Ashton
(74) *Attorney, Agent, or Firm*—Alan P. Kass

(57) ABSTRACT

The present invention relates to a photoresist composition suitable for image-wise exposure and development as a negative photoresist comprising a negative photoresist composition and an inorganic particle material having an average particle size equal or greater than 10 nanometers, wherein the thickness of the photoresist coating film is greater than 5 microns. The negative photoresist composition is selected from (1) a composition comprising (i) a resin binder, (ii) a photoacid generator, and (iii) a cross-linking agent; or (2) a composition comprising (i) a resin binder, (ii) optionally, addition-polymerizeable, ethylenically unsaturated compound(s) and (iii) a photoinitiator; or (3) a composition comprising (i) a photopolymerizable compound containing at least two pendant unsaturated groups; (ii) ethylenically unsaturated photopolymerizable polyalkylene oxide hydrophilic compound(s); and (iii) a photoinitiator.

10 Claims, No Drawings

NANOCOMPOSITE PHOTOSENSITIVE COMPOSITION AND USE THEREOF

TECHNICAL FIELD

The present invention related to improving the developing characteristics of certain photoresist polymer compositions without sacrificing their resolution properties. The present invention is of particular importance in achieving high aspect ratio patterning which does not leave photoresist residue or scum in patterned areas as well as having good etch resistance.

BACKGROUND OF THE INVENTION

In the manufacture of patterned structures, such as wafer level packaging, electrochemical deposition of electrical interconnects has been used as the density of the interconnects increase. For example, see Solomon, Electrochemically Deposited Solder Bumps for Wafer-Level Packaging, Packaging/Assembly, Solid State Technology, pages 84–88, April 2001; disclosure of which is incorporated herein by reference. Wafer level packaging produces a chip/die/device that is ready for direct assembly onto the final substrate or final system platform. Wafer-level packaging is used for making electrical connections to an integrated circuit chip above the active circuitry and is especially important as the density of inputs and outputs (I/Os) on chips increases.

Wafer-level packaging schemes use a technique known as redistribution to connect the peripheral pads to an area array of solder bumps on the surface of the wafer. The basic sequence of wafer-level packaging with redistribution involves creating a level of interconnect that defines an under-bump pad that is connected to the peripheral bonding pad. The under-bump pad is exposed by a via in a dielectric layer. Then the entire wafer receives an under-bump metallurgy (UBM) stack that provides an electroplating seed layer on top of a diffusion barrier and adhesion layer. The plating mask is formed in photoresist that can range from about 1 µm to over 200 µm thick, but are typically 25–125 µm thick. Layers exceeding about 100 µm to about 125 µm are typically applied in double coats. The solder bump is electroplated within the via in the case when a thicker photoresist is used. The solder bump is typically electroplated above the photoresist when it is <50 µm thick (overplating or mushroom plating). The photoresist is then stripped and the UBM is etched away everywhere it is not covered by the solder bumps. Finally, the bumps are reflowed, causing them to reform in the shape of truncated spheres.

Gold bumps, copper posts and copper wires for redistribution in wafer level packaging require a resist mold that is later electroplated to form the final metal structures in advanced interconnect technologies. The resist layers are very thick compared to the photoresists used in the IC manufacturing. Both feature size and resist thickness are typically in the range of 5 µm to 100 µm, so that high aspect ratios (resist thickness to line size) have to be patterned in the photoresist.

Photoresists of the present invention also have use in flat panel displays when added pigments are added to the compositions herein.

Concerning the photoresist, photopolymerizable compositions for imaging have long been known in the art. For instance, U.S. Pat. No. 2,760,863 suggested using photopolymerizable compositions in the preparation of printing plates. More recently, similar compositions have been suggested for color proofing systems for the print industry. Since then, a variety of such photopolymerizable compositions have been described and the use of photopolymerizable compositions are now used in microlithography.

The pattern is formed by image-wise exposing the resist material to irradiation by lithographic techniques. The irradiation employed is usually X-ray, UV radiation, electron beam radiation or ion-beam radiation.

The compositions of the present invention are negative-working photoresist compositions. Negative-working photoresist compositions are exposed image-wise to radiation, the areas of the resist composition exposed to the radiation become less soluble to a developer solution (e.g. a cross-linking reaction occurs) while the unexposed areas of the photoresist coating remain relatively soluble to such a solution. Thus, treatment of an exposed negative-working resist with a developer causes removal of the non-exposed areas of the photoresist coating and the creation of a negative image in the coating, thereby uncovering a desired portion of the underlying substrate surface on which the photoresist composition was deposited.

The compositions of the present invention also have good plasma etch resistance and heat deformation resistance. The compositions of the present invention are also useful in the production of MEMS.

Aqueous developable photopolymerizable compositions are of especial interest for negative working photoresist compositions. The polymeric binders for such compositions can contain acidic functionality so that the binder polymer is soluble in alkaline aqueous solution and thereby renders the photopolymerizable composition developable in alkaline aqueous solutions. Those in the art will also appreciate that resin binders can be used which are then developable using non-aqueous solvents.

In the literature, carboxylic acid functionalized acrylic polymers are used as the binder polymers. To ensure the physical performances of the imaged patterns, high molecular weight polymers were utilized which may render slower development rates.

SUMMARY OF THE INVENTION

The present invention is related to a photoresist composition suitable for image-wise exposure and development as a negative photoresist comprising a negative photoresist composition and an inorganic particle material having an average particle size equal or greater than 10 nanometers, wherein the thickness of the photoresist coating film is greater than 5 microns. The negative photoresist composition can be selected from (1) a composition comprising (i) a resin binder, (ii) a photoacid generator, and (iii) a cross-linking agent; or (2) a composition comprising (i) a resin binder, (ii) optionally, addition-polymerizeable, ethylenically unsaturated compound(s) and (iii) a photoinitiator; or (3) a composition comprising (i) a photopolymerizable compound containing at least two pendant unsaturated groups; (ii) ethylenically unsaturated photopolymerizable polyalkylene oxide hydrophilic compound(s); and (iii) a photoinitiator.

DETAILED DESCRIPTION OF THE INVENTION

The present invention is related to a photoresist composition suitable for image-wise exposure and development as a negative photoresist comprising a negative photoresist composition and an inorganic particle material having an average particle size equal or greater than 10 nanometers, wherein the thickness of the photoresist coating film is greater than 5 microns. The negative photoresist composition can be selected from (1) a composition comprising (i) a resin binder, (ii) a photoacid generator, and (iii) a crosslinking agent; or (2) a composition comprising (i) a resin binder, (ii) optionally, addition-polymerizeable, ethylenically unsaturated compound(s) and (iii) a photoinitiator; or (3) a composition comprising (i) a photopolymerizable compound containing at least two pendant unsaturated groups; (ii) ethylenically unsaturated photopolymerizable polyalkylene oxide hydrophilic compound(s); and (iii) a photoinitiator.

Those of ordinary skill in the art are well familiar with photoresist compositions suitable for image-wise exposure and development as a negative photoresist.

In certain embodiments of the present invention, the resin binders may comprise a novolak, preferably derived from a substituted phenol such as ortho-cresol; meta-cresol; para-cresol; 2,4-xylenol; 2,5-xylenol; 3,4-xylenol, 3,5-xylenol; thymol and mixtures thereof, that has been condensed with an aldehyde such as formaldehyde. The binder resin may also comprise a poly(vinyl phenol) such as a poly(para-hydroxystyrene); a poly(para-hydroxy-alpha-methylstyrene; a copolymer of para-hydroxystyrene or para-hydroxy-alpha-methylstyrene and styrene, acetoxystyrene or acrylic acid and/or methacrylic acid; a hydroxyphenylalkyl carbinol homopolymer; or a novolak/poly(vinyl phenol) copolymer. The methods for obtaining novolak resins are well known to those skilled in the art. For example, novolak resins are described in U.S. Pat. No. 3,825,430 where resins can be made from condensation product of phenol, or its derivatives, and formaldehyde. The content of this patent U.S. Pat. No. 3,825,430 is hereby incorporated herein by reference.

Crosslinking agents are those agents which are capable of forming a crosslinked structure under the action of an acid. Some examples of crosslinking agents include aminoplasts such as, for example, glycoluril-formaldehyde resins, melamine-formaldehyde resins, benzoguanamine-formaldehyde resins, and urea-formaldehyde resins. The use of methylated and/or butylated forms of these resins is highly preferred for obtaining long storage life (3–12 months) in catalyzed form. Highly methylated melamine-formaldehyde resins having degrees of polymerization less than two are useful. Monomeric, methylated glycoluril-formaldehyde resins are useful, when needed, with the photoresist composition of the present invention. One example is N,N,N,N-tetra(alkoxymethyl)glycoluril. Examples of N,N,N,N-tetra(alkoxymethyl)glycoluril, may include, e.g., N,N,N,N-tetra(methoxymethyl)glycoluril, N,N,N,N-tetra(ethoxymethyl)glycoluril, N,N,N,N-tetra(n-propoxymethyl)glycoluril, N,N,N,N-tetra(i-propoxymethyl)glycoluril, N,N,N,N-tetra(n-butoxymethyl)glycoluril and N,N,N,N-tetra(t-butoxymethyl)glycoluril. N,N,N,N-tetra(methoxymethyl)glycoluril is available under the trademark POWDERLINK from Cytec Industries (e.g., POWDERLINK 1174). Other examples include methylpropyltetramethoxymethyl glycoluril, and methylphenyltetramethoxymethyl glycoluril. Similar materials are also available under the NIKALAC tradename from Sanwa Chemical (Japan).

Other aminoplast crosslinking agents are commercially available from Cytec Industries under the trademark CYMEL and from Monsanto Chemical Co. under the trademark RESIMENE. Condensation products of other amines and amides can also be employed, for example, aldehyde condensates of triazines, diazines, diazoles, guanidines, guanimines and alkyl- and aryl-substituted derivatives of such compounds, including alkyl- and aryl-substituted melamines. Some examples of such compounds are N,N'-dimethyl urea, benzourea, dicyandiamide, formaguanamine, acetoguanamine, ammeline, 2-chloro-4,6-diamino-1,3,5-triazine, 6-methyl-2,4-diamino, 1,3,5-triazine, 3,5-diaminotriazole, triaminopyrimidine,2-mercapto-4,6-diamino-pyrimidine, 3,4,6-tris(ethylamino)-1,3,5-triazine, tris(alkoxycarbonylamino)triazine, N,N,N',N'-tetramethoxymethyl urea, methylolbenzoguanamine or alkyl ether compound thereof, such as tetramethylolbenzoguanamine, tetramethoxymethylbenzoguanamine and trimethoxymethylbenzoguanamine; 2,6-bis(hydroxymethyl)4-methylphenol or alkyl ether compound thereof; 4-tert-butyl-2,6-bis(hydroxymethyl)phenol or alkyl ether compound thereof; 5-ethyl-1,3-bis(hydroxymethyl)perhydro-1,3,5-triazin-2-one (common name: N-ethyldimethyloltriazine) or alkyl ether compound thereof; N,N-dimethyloltrimethyleneurea or dialkyl ether compound thereof; 3,5-bis(hydroxymethyl)perhydro-1,3,5-oxadiazin-4-one (common name: dimethylolurone) or alkyl ether compound thereof; and tetramethylolglyoxazaldiurein or dialkyl ether compound thereof and the like.

Other possible crosslinking agents include: 2,6-bis(hydroxymethyl)-p-cresol and compounds having the following structures:

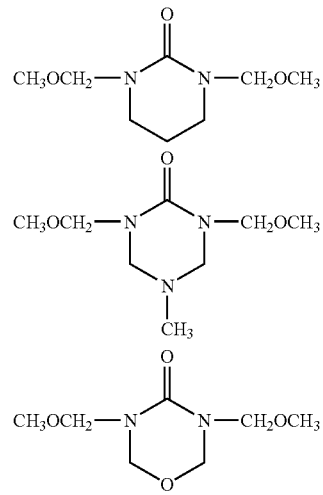

including their analogs and derivatives, such as those found in Japanese Laid-Open Patent Application (Kokai) No. 1-293339 to Tosoh, methylolmelamines, such as hexamethylolmelamine, pentamethylolmelamine, and tetramethylolmelamine as well as etherified amino resins, for example alkoxylated melamine resins (for example, hexamethoxymethylmelamine, pentamethoxymethylmelamine, hexaethoxymethylmelamine, hexabutoxymethylmelamine and tetramethoxymethylmelamine) or methylated/butylated glycolurils, for example as well as those found in Canadian Patent No. 1 204 547 to Ciba Specialty Chemicals. Other examples include, for example, N,N,N,N-tetrahydroxymethylglycoluril, 2,6-dihydroxymethylphenol, 2,2',6,6'-tetrahydroxymethyl-bisphenol A, 1,4-bis[2-(2-hydroxypropyl)]benzene, and the like, etc. Other examples of crosslinking agents include those described in U.S. Pat. No. 4,581,321, U.S. Pat. No. 4,889,789, and DE-A 36 34 371, the contents of which are incorporated by reference. Various melamine and urea resins are commercially available under the Nikalacs (Sanwa Chemical Co.), Plastopal (BASF AG), or Maprenal (Clariant GmbH) tradenames.

The crosslinking agent can be used individually or in mixtures with each other. The crosslinking agent is added to the composition in a proportion which provides from about 0.10 to about 2.00 equivalents of crosslinking function per reactive group on the polymer.

Other resin binders can include acid functional monomers and/or oligomers thereof and non-acid functional monomers and/or oligomers thereof and oligomers and/or polymers derived from mixtures of acid functional monomers and non-acid functional monomers, and mixtures thereof. These acid functional monomers and/or oligomers thereof and non-acid functional monomers and/or oligomers thereof and mixtures thereof can also function as addition-polymerizable, ethylenically unsaturated compounds for the present invention.

Examples of acid functional and non-acid functional monomers include monomers such as, for example, and not limited to, acrylic acid, methacrylic acid, maleic acid, maleic anhydride, fumaric acid, fumaric anhydride, citraconic acid, citraconic anhydride, itaconic acid, itaconic anhydride, vinyl carboxylic acid, 2-acrylamido-2-methylpropanesulfonic acid, 2-hydroxyethyl acryloyl phosphate, 2-hydroxypropyl acryloyl phosphate, 2-hydroxy-α-acryloyl phosphate, and the like; esters of acrylic acids, for example, methyl acrylate, methyl methacrylate, hydroxyl ethyl methacrylate, hydroxyl ethyl acrylate, butyl methacrylate, octyl acrylate, 2-ethoxy ethyl methacrylate, t-butyl acrylate, n-butyl acrylate, 2-ethyl hexylacrylate, n-hexyl acrylate, 2-hydroxyethyl acrylate, 2-hydroxypropyl acrylate, 3-hydroxypropyl acrylate, 2-hydroxybutyl acrylate, 3-hydroxybutyl acrylate, 4-hydroxybutyl acrylate, 2-hydroxyethyl methacrylate, 2-hydroxypropyl methacrylate, 3-hydroxypropyl methacrylate, 2-hydroxybutyl methacrylate, 3-hydroxybutyl methacrylate, 4-hydroxybutyl methacrylate, allyl acrylate, allyl methacrylate, benzyl acrylate, benzyl methacrylate, cyclohexyl acrylate, cyclohexyl methacrylate, methoxypropylene glycol acrylate, methoxypropylene glycol methacrylate, methoxydiethylene glycol acrylate, methoxydiethylene glycol methacrylate, methoxytripropylene glycol acrylate, methoxytripropylene glycol methacrylate, isobornyl acrylate, isobornyl methacrylate, dicyclopentadienyl acrylate, dicyclopentadienyl methacrylate, 2-hydroxy-3-phenoxypropyl acrylate, 2-hydroxy-3-phenoxypropyl methacrylate, mevaloniclactone methacrylate, 2-methyladamantyl methacrylate, isoadamantyl methacrylate, 3-hydroxy-1-methacryloxyadamatane, 3,5-dihydroxy-1-methacryloxyadamantane, β-methacryloxy-y-butyrolactone, α-methacryloxy-y-butyrolactone, 1,5-pentanediol diacrylate, N,N-diethylaminoethyl acrylate, ethylene glycol diacrylate, 1,3-propanediol diacrylate, decamethylene glycol diacrylate, decamethylene glycol dimethacrylate, 1,4-cyclohexanediol diacrylate, 2,2-dimethylol propane diacrylate, glycerol diacrylate, tripropylene glycol diacrylate, glycerol triacrylate, 2,2-di(p-hydroxyphenyl)-propane dimethacrylate, triethylene glycol diacrylate, polyoxyethyl-2-2-di(p-hydroxyphenyl)-propane dimethacrylate, triethylene glycol dimethacrylate, polyoxypropyltrimethylol propane triacrylate, ethylene glycol dimethacrylate, butylene glycol dimethacrylate, 1,3-propanediol dimethacrylate, 1,2,4-butanetriol trimethacrylate, 2,2,4-trimethyl-1,3-pentanediol dimethacrylate, pentaerythritol trimethacrylate, 1-phenyl ethylene-1,2-dimethacrylate, pentaerythritol tetramethacrylate, trimethylol propane trimethacrylate, 1,5-pentanediol diacrylate, 1,4-benzenediol dimethacrylate, 2-acetoacetoxyethylmethacrylate, 2-acetoacetoxyethylacrylate, 3-acetoacetoxypropylmethacrylate, 3-acetoacetoxypropylacrylate, 2-acetoacetoamidoethylmethacrylate, and 2-acetoacetoamidoethylacrylate; aromatic vinyl compounds such as styrene, α-methylstyrene, dimethylstyrene, trimethylstyrene, ethylstyrene, isopropylstyrene, o-methoxystyrene, m-methoxystyrene, p-methoxystyrene, o-vinyltoluene, m-vinyltoluene, p-vinyltoluene, o-vinylbenzyl methyl ether, m-vinylbenzyl methyl ether, p-vinylbenzyl methyl ether, o-vinylbenzyl glycidyl ether, m-vinylbenzyl glycidyl ether, p-vinylbenzyl glycidyl ether, acetoxystyrene, chlorostyrene, dichlorostyrene, bromostyrene, vinylbenzoic acid methyl ester, etc., divinylbenzene, and vinyl toluene and vinyl esters, such as vinyl acrylate and vinyl methacrylate, and the like.

By the term "aryl" is meant a radical derived from an aromatic hydrocarbon by the elimination of one atom of hydrogen and can be substituted or unsubstituted. The aromatic hydrocarbon can be mononuclear or polynuclear. Examples of aryl of the mononuclear type include phenyl, tolyl, xylyl, mesityl, cumenyl, and the like. Examples of aryl of the polynuclear type include naphthyl, anthryl, phenanthryl, and the like. The aryl group can have at least one substituent selected from, as for example, halogen, hydroxy, cyano, carboxy, nitro, amino, lower alkyl, lower alkoxy, and the like.

As used herein, the term "alkaryl" means an aryl group bearing an alkyl group; the term "aralkyl" means an alkyl group bearing an aryl group; the term "arylalkaryl" means an aryl group bearing an alkyl group bearing an aryl group By the term "carbocyclic ring" is meant an unsubstituted or substituted, saturated, unsaturated or aromatic, hydrocarbon ring radical. Carbocyclic rings are monocyclic or are fused, bridged or spiro polycyclic ring systems. Examples include norbornene, adamantane, and tetracyclododecene. The substituents on the carbocyclic ring may be aliphatic or cycloaliphatic alkyls, esters, acids, hydroxyl, nitrile, alkyl derivatives, and the like.

As used herein, "aralkyloxy" is an oxygen radical having an aralkyl substituent.

As used herein, "aryloxy" is an oxygen radical having an aryl substituent (i.e., —O-aryl).

Other examples of resin binders include a photopolymerizable compound containing at least two pendant unsaturated groups, such as, for example, styrene/maleic anhydride oligomers which have been partially esterified with ethylenic unsaturation, preferably, acrylic or methacrylic functionality. A typical styrene/maleic anhydride oligomer is a copolymer of styrene and maleic anhydride with a mole ratio of about 1:1 but can range from 1:4 to 4:1. The styrene/maleic anhydride oligomer is available, for example as SMA-1000, SMA-2000, and SMA-3000 (Sartomer Company) and are described in U.S. Pat. Nos. 3,825,430; 4,820,773; and 6,074,436, the contents relating to such styrene/maleic anhydride resins being incorporated by reference. The styrene/maleic anhydride oligomer can then be reacted with, for example, a hydroxyalkylacrylyl or HO—X, where X is defined above (examples of which include hydroxyethyl acrylate, hydroxyethyl methacrylate, hydroxypropyl acrylate, hydroxypentyl methacrylate). This kind of reaction is described in, for example, U.S. Pat. No. 3,825,430. Styrene/maleic anhydride half-ester oligomers are also available from Sartomer Company under the SARBOX® tradename.

Other examples of resin binders include those found in U.S. Pat. Nos. 4,722,947; 4,745,138; 5,137,952: 6,329,123; 6,262,132; 4,491,628; 6,358,665 (which also provides further examples of photoacid generators); U.S. Pat. Nos. 6,576,394, and 3,825,430, the contents of which are hereby incorporated herein by reference. Further examples include t-butyloxycarbonyl p-hydroxystyrene/p-hydroxystyene; acrylate (or methacrylate)/p-hydroxystyrene copolymers; acrylate (or methacrylate)/p-hydroxystyrene/styrene copolymers; cycloolefin-based polymers; and acrylate (or methacrylate) based polymers. Other examples are also found in co-pending U.S. patent application Ser. No. 10/376,356, the contents of which are hereby incorporated herein by reference. One resin of interest is one of the formula:

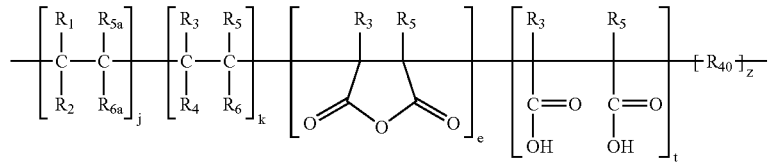

wherein $R_1$ and $R_2$ may be the same or different and each may independently be selected from the group consisting of hydrogen, $C_{1-50}$ alkyl, $C_{6-20}$ aryl, $C_{1-20}$ alkaryl, $C_{1-20}$ aralkyl, $C_{1-10}$ alkoxy, $C_{3-18}$ cycloalkyl, $C_{2-20}$ alkenyl, 2,3-epoxy propyl, cyano, and halogen, the $C_{1-50}$ alkyl, $C_{6-20}$ aryl, $C_{1-20}$ alkaryl, $C_{1-20}$ aralkyl, $C_{1-10}$ alkoxy, $C_{3-18}$ cycloalkyl, and $C_{2-20}$ alkenyl being unsubstituted or substituted by one or more $C_{3-12}$ cycloalkyl, cyano, $C_{1-5}$ alkyl, $C_{1-6}$ alkoxy, $C_{6-20}$ aryloxy, $C_{1-20}$ aralkyloxy, 2,3-epoxy propyl, hydroxyl, or halogen groups;

$R_3$ is selected from the group consisting of hydrogen, $C_{1-50}$ alkyl, $C_{6-20}$ aryl, $C_{1-20}$ alkaryl, $C_{1-20}$ aralkyl, $C_{3-18}$ cycloalkyl, $C_{2-20}$ alkenyl, cyano, 2,3-epoxy propyl, and halogen, the $C_{1-50}$ alkyl, $C_{6-20}$ aryl, $C_{1-20}$ alkaryl, $Cl_{-20}$ aralkyl, $C_{3-18}$ cycloalkyl, and $C_{2-20}$ alkenyl being unsubstituted or substituted by one or more $C_{3-12}$ cycloalkyl, cyano, $C_{1-5}$ alkyl, $C_{1-6}$ alkoxy, $C_{6-20}$ aryloxy, $Cl_{-20}$ aralkyloxy, 2,3-epoxy propyl, hydroxyl, or halogen groups;

$R_4$, $R_6$, and $R_{6a}$ may be the same or different and each may independently be selected from the group consisting of hydrogen, cyano, $C_{1-50}$ alkyl, $C_{6-20}$ aryl, $C_{1-20}$ alkaryl, $C_{1-20}$ aralkyl, $C_{3-18}$ cycloalkyl, $C_{2-20}$ alkenyl, halogen, an oxyalkylated group containing from 2 to 4 carbon atoms in each oxyalkylated group, which group may be of 1 to 20 repeating units and which terminates with hydrogen or $C_{1-4}$ alkyl, X, and —$(CH_2)_n$—C(=O)—$OR_7$, where $R_7$ is selected from hydrogen, $C_{1-50}$ alkyl, $C_{6-20}$ aryl, $C_{1-20}$ alkaryl, $C_{1-20}$ aralkyl, $C_{2-20}$ alkenyl, $C_{5-50}$ carbocyclic ring, $NR_{7a}R_{7b}$, 2,3-epoxy propyl, n is a whole number from 0 to 3, the $C_{1-50}$ alkyl, $C_{6-20}$ aryl, $C_{1-20}$ alkaryl, $C_{1-20}$ aralkyl, $C_{3-18}$ cycloalkyl, $C_{2-20}$ alkenyl, and $C_{5-50}$ carbocyclic ring being unsubstituted or substituted by one or more $C_{3-12}$ cycloalkyl, cyano, $C_{1-5}$ alkyl, $C_{1-6}$ alkyoxy, $C_{6-20}$ aryloxy, $C_{1-20}$ aralkyloxy, 2,3-epoxy propyl, hydroxyl, or halogen groups, each of $R_{7a}$ and $R_{7b}$ are independently hydrogen or $C_{1-20}$ alkyl and X is —C(=O)—$R_{10}$ or —$R_{60}$—C(=O)—$CH_2$—$R_{70}$ where $R_{10}$ is selected from the group consisting of —O—$R_{11}$—O—C(=O)—C($R_{12}$)=$CH_2$, —O—$R_{11}$—NH—O—C(=O)—C($R_{12}$)=$CH_2$, and —NH—$R_{11}$—O—C(=O)—C($R_{12}$)=$CH_2$, where $R_{11}$ is a linear or branched divalent $C_{1-40}$ alkylene or an oxyalkylated derivative thereof containing from 2 to 4 carbon atoms in each oxylalkylated group, which group may be of 1 to 20 repeating units; $R_{60}$ is —C(=O)—W—$R_{11}$—V—; each of W and V are independently selected from O, S or $NR_{100}$ where $R_{100}$ is hydrogen or $C_{1-6}$ alkyl; $R_{11}$ is as above, $R_{70}$ is —C(=O)—$R_{50}$ or —cyano, where $R_{50}$ is hydrogen or $C_{1-10}$ alkyl;

$R_{12}$ is hydrogen or $C_{15}$ alkyl;

$R_5$ and $R_{5a}$ may be the same or different and each may be independently selected from the group consisting of hydrogen, $C_{1-50}$ alkyl, $C_{6-20}$ aryl, $C_{1-20}$ alkaryl, $C_{1-20}$ aralkyl, $C_{3-18}$ cycloalkyl, $C_{2-20}$ alkenyl, cyano, 2,3-epoxy propyl, halogen and carboxy, the $C_{1-50}$ alkyl, $C_{6-20}$ aryl, $C_{1-18}$ alkaryl, $C_{1-20}$ aralkyl, $C_{2-20}$ alkenyl, and $C_{3-12}$ cycloalkyl being unsubstituted or substituted by one or more $C_{3-12}$ cycloalkyl, cyano, $C_{1-5}$ alkyl, $C_{1-6}$ alkoxy, $C_{6-20}$ aryloxy, $C_{1-20}$ aralkyloxy, 2,3-epoxy propyl, hydroxyl, or halogen groups; and $R_{40}$ is any monomer that is copolymerizable with moieties found in [ ]$_j$, [ ]$_k$, [ ]$_e$, and/or [ ]$_t$, including those moieties identified for [ ]$_j$, [ ]$_k$, [ ]$_e$, and/or [ ]$_t$; and j, k, e, t, and z are each whole numbers such that the sum of j, k, e, t, and z ranges from about 2 to about 20, with j and k each being equal to or greater than 1, and z, e and/or t may be zero.

Preferable embodiments of this compound include those wherein either $R_1$ is hydrogen and $R_2$ is $C_{6\text{-}10\ 20}$ aryl unsubstituted or substituted by one or more $C_{3-12}$ cycloalkyl, $C_{1-6}$ alkoxy, 2,3-epoxy propyl, hydroxyl, cyano, $C_{1-5}$ alkyl, or halogen groups; $R_{5a}$ is hydrogen; $R_{6a}$ is hydrogen; $R_3$ is hydrogen; $R_4$ in is —$(CH_2)_n$—C(=O)—$OR_7$, where $R_7$ is hydrogen, and n is 0; $R_5$ is hydrogen; $R_6$ in is X where X is —C(=O)—$R_{10}$ where $R_{10}$ is —O—$R_{11}$—O—C(=O)—C($R_{12}$)=$CH_2$, $R_{11}$ is a $C_2$ alkylene, $R_{12}$ is hydrogen; e and t are each not zero, and z is zero; or $R_1$ is hydrogen and $R_2$ is $C_{6\text{-}10\ 20}$ aryl unsubstituted or substituted by one or more $C_{3-12}$ cycloalkyl, $C_{1-6}$ alkoxy, 2,3-epoxy propyl, hydroxyl, cyano, $C_{1-5}$ alkyl, or halogen groups; $R_{5a}$ is hydrogen; $R_{6a}$ is hydrogen; $R_3$ is hydrogen; $R_4$ in is —$(CH_2)_n$—C(=O)—$OR_7$, where $R_7$ is hydrogen, and n is 0; $R_5$ is hydrogen; $R_6$ in is X where X is —C(=O)—$R_{10}$ where $R_{10}$ is —O—$R_{11}$—O—C(=O)—C($R_{12}$)=$CH_2$, $R_{11}$ is a $C_2$ alkylene, $R_{12}$ is hydrogen; each of e, t and z are not zero; and $R_{40}$ is $$\left[\begin{array}{cc} R_3 & R_5 \\ | & | \\ C-C \\ | & | \\ R_4 & R_6 \end{array}\right]_z$$

where $R_3$ in [ ]$_z$ and $R_5$ in [ ]$_z$ are hydrogen, $R_4$ in [ ]$_z$ is —$(CH_2)_n$—C(=O)—$OR_7$, where $R_7$ is hydrogen, n is 0; $R_6$ in [ ]$_z$ is —$(CH_2)_n$—C(=O)—$OR_7$, where $R_7$ is $C_{1-50}$ alkyl substituted by $C_{1-6}$ alkoxy, and n is 0; or $R_1$ is hydrogen and $R_2$ is $C_{6\text{-}10\ 20}$ aryl unsubstituted or substituted by one or more $C_{3-12}$ cycloalkyl, $C_{1-6}$ alkoxy, 2,3-epoxy propyl, hydroxyl, cyano, $C_{1-5}$ alkyl, or halogen groups; $R_{5a}$ is hydrogen; $R_{6a}$ is hydrogen; $R_3$ is hydrogen; $R_4$ in is —$(CH_2)_n$—C(=O)—$OR_7$, where $R_7$ is hydrogen, and n is 0; $R_5$ is hydrogen; $R_6$ in is X where X is —C(=O)—

$R_{10}$ where $R_{10}$ is —O—$R_{11}$—O—C(=O)—C($R_{12}$)=CH$_2$, $R_{11}$, is a $C_2$ alkylene, $R_{12}$ is hydrogen; and each of e, t and z are each zero.

The amount of resin binder in the composition ranges from about 30 to about 55% by weight, and more typically from about 35 to about 50% by weight.

Certain compositions of the present invention also contain at least one ethylenically unsaturated photopolymerizable polyalkylene oxide hydrophilic monomer which typically crosslinks by photo-induced free radical polymerization forming the desired insoluble pattern. The polyalkyene oxide segment should typically be long enough to render a certain degree of aqueous solubility, but not too long to compromise physical-chemical properties of the crosslinked material to be able to withstand a post image process such as metal plating. Herein, alkylene oxide refers to ethylene or propylene oxide and poly- means 1 or more, for example 1 to 100, more preferably 2 to 10.

The hydrophilic polyalkylene oxide monomer typically has a multi (that is, 2 or more) α,β-ethylenically unsaturated function and from 2 to 10 ethylene oxide or propylene oxide units. In such monomers, the α,β-ethylenically unsaturated moieties, typically acrylic or methacrylic units, are esterified with the alkylene oxide units. The ethylene and/or propylene oxide units render the monomers hydrophilic and therefore more compatible with the aqueous developer. Ethylene oxide units are preferred to propylene oxide units as they are more hydrophilic. If propylene oxide units are used, typically a greater number of such units are used per monomer molecule than if ethylene oxide units were used.

Examples of the at least one ethylenically unsaturated photopolymerizable polyalkylene oxide hydrophilic monomer include, but are not limited to, diethylene glycol diacrylate, triethylene glycol diacrylate, diethylene glycol dimethacrylate, triethylene glycol dimethacrylate, tripropylene glycol diacrylate, tripropylene glycol dimethacrylate, tetraethylene glycol diacrylate, tetraethylene glycol dimethacrylate, pentaethylene glycol diacrylate, pentaethylene glycol dimethacrylate, pentapropylene glycol diacrylate, pentapropylene glycol dimethacrylate, propoxylated (3) trimethylolpropane triacrylate, propoxylated (6) trimethylolpropane triacrylate, ethoxylated (3) trimethylolpropane triacrylate, ethoxylated (6) trimethylolpropane triacrylate, ethoxylated (9) trimethylolpropane triacrylate, propoxylated trimethylolpropane triacrylates, propoxylated trimethylolpropane trimethacrylates, ethoxylated (2) bisphenol A dimethacrylate, ethoxylated (3) bisphenol A diacrylate, ethoxylated (4) bisphenol A dimethacrylate, ethoxylated (8) bisphenol A diacrylate, ethoxylated (4) bisphenol A diacrylate, ethoxylated (6) bisphenol A diacrylate, ethoxylated (6) bisphenol A dimethacrylate, propoxylated (2) neopentyl glycol diacrylate, propoxylated (3) glyceryl triacrylate, polyethylene glycol diacrylates, polyethylene glycol dimethacrylates, polypropylene glycol diacrylates, polypropylene glycol dimethacrylates, ethoxylated (4) pentaerythritol tetraacrylate, highly propoxylated (5.5) glyceryl triacrylate, ethoxylated glyceryl triacrylate, and propoxylated (3) glyceryl triacrylate, and the like. Examples of the foregoing can be obtained from Sartomer Company (Exton, Pa.). Further examples of hydrophilic polyalkylene oxide monomers can be found in U.S. Pat. Nos. 3,368,900, 3,380,831, and 4,180,474.

The amount of the hydrophilic polyalkylene oxide monomer, when used, is typically present in the composition in amounts of from about 5 to about 35% by weight, and more typically about 10 to about 20% by weight in the composition.

Other examples of resin binder and cross-linking agent compositions include a novolak resin with an aminoplast cross-linking agent; acid functional polymers combined with non-acid functional monomers, and the like.

Certain compositions of the present invention also contain least one photoinitiator. Suitable photoinitiators include, for example, 9-phenyl acridine, 9-phenyl acridine homologues (such as those described in U.S. Pat. No. 5,217,845, which is incorporated herein by reference; examples of which include 2,7-dibenzoyl-9-phenylacridine, 2,7-bis(α-hydroxybenzyl)-9-phenylacridine, 2,7-bis(α-acetoxybenzyl)-9-phenylacridine, 2,7-dimethyl-9-(4-methylphenyl)acridine, 2,7-dimethyl-9-phenylacridine, 2,7-bis(3,4-dimethylbenzoyl)-9-(3,4-dimethylphenyl)acridine, 2,7-bis(α-acetoxy-4-tertbutylbenzyl)-9-(4-tert-butylphenyl)acridine, 2,7-dimethyl-9-(3,4-dichlorophenyl)acridine, 2,7-dimethyl-9-(4-benzoylphenyl )acridine, 2,7-bis(2-chlorobenzoyl )-9-(2-chlorophenyl )acridine, 2-(α-hydroxy-3-bromobenzyl)-6-methyl-9-(3-bromophenyl)acridine, 2,5-bis(4-tert-butylbenzoyl)-9-(4-tertbutylphenyl)acridine, 1,4-bis(2,7-dimethyl-9-acridinyl)benzene, 2,7-bis(α-phenylaminocarbonyloxy-3,4-dimethylbenzyl)-9-(3,4-dimethyl phenyl)acridine and 2,7-bis(3,5-dimethyl-4-hydroxy-4'-fluorodiphenylmethyl)-9-(4-fluorophenyl) acridine), acyloins (e.g., benzoin, pivaloin, and the like), acyloin ethers (e.g., benzoin methyl ether, benzoin ethyl ether, benzoin propyl ether, and the like), α-diketone compounds or monoketal derivatives thereof (e.g., diacetyl, benzil, benzyl dimethyl ketal, and the like), hydrogen abstraction-type initiators (e.g., xanthone, thioxanthone, 2-isopropylthioxanthone, 4-isopropylthioxanthone, 2-chlorothioxanthone, 2-methylthioxanthone, benzil, benzophenone, acetophenones, 2,2-diethoxyacetophenone, 2-hydroxy-2-methylpropiophenone, 4-isopropyl-2-hydroxy-2-methylpropiophenone, and 1,1-dichloroacetophenone, 4,4'bis(N,N'-dimethylamino)benzophenone, polynuclear quinones (e.g., 9,10-anthraquinone, 9,10-phenanthrenequinone, 2-ethyl anthraquinone, 1,4-naphthoquinone), and the like), acyl phosphine oxides, and the like, as well as mixtures of any two or more thereof. Further examples of photoinitiators include 2,4-bis-trichloromethyl-6-(3-bromo-4-methoxy)phenyl-s-triazine, 2,4-bis-trichloromethyl-6-(2-bromo-4-methoxy)-phenyl-s-triazine, 2,4-bis-trichloromethyl-6-(3-bromo-4-methoxy)styrylphenyl-s-triazine, 2,4-bis-trichloromethyl-6-(2-bromo-4-methoxy)styrylphenyl-s-triazine, bis(cyclopentadienyl)-bis[2,6-di-fluoro-3-(pyrr-1-yl)phenyl]titanium, bis(cyclopentadienyl)bis[2,6-difluoro-2-(pyrr-1-yl)phenyl]titanium, bis(cyclopentadienyl)-bis(2,3,4,5,6-pentafluorophenyl)titanium, bis-(cyclopentadienyl)-bis[2,5-difluoro-3-(pyrr-1-yl)phenyl]-titanium, 1-hydroxycyclohexyl phenyl ketone, 2,2-dimethoxy-1,2-diphenylethan-1-one, 2-methyl-1-[4-(methylthio)phenyl]-2-morpholinopropan-1-one, 2-benzyl-2-dimethylamino-1-(4-morpholinophenyl)-butan-1-one, 2-hydroxy-2-methyl-1-phenylpropan-1-one, 2,4,6-trimethylbenzoyldiphenylphosphine oxide, 1-[4-(2-hydroxyethoxy)phenyl]-2-hydroxy-2-methyl-1-propan-1-one, 2,4-diethylthioxanthone, 2,4-dimethylthioxanthone, 1-chloro-4-propoxythioxanthone, 3,3-dimethyl-4-methoxybenzophenone, 1-(4-isopropyl phenyl)-2-hydroxy-2-methylpropan-1-one, 1-(4-dodecylphenyl )-2-hydroxy-2-methylpropan-1-one, 4-benzoyl-4'-methyldimethylsulfide, 4-dimethylaminobenzoic acid, methyl 4-dimethylaminobenzoate, ethyl 4-dimethylaminobenzoate, n-butyl 4-dimethylaminobenzoate, 2-ethylhexyl-4-dimethylaminobenzoate, 2-isoamyl-4-dimethyl aminobenzoate, 2,2-diethoxyacetophenone, benzyl β-methoxyethyl acetal, 1-phenyl-1,2- propanedi-one-2-(o-ethoxycarbonyl)oxime, methyl o-benzoylbenzoate, bis(4-dimethylaminophenyl)ketone, p-dimethylaminoacetophenone, p-tert-butyl-trichloroacetophenone, p-tert-butyl-dichloro-acetophenone, dibenzosuberone, α,α-dichloro-4-phenoxyacetophenone, pentyl 4-dimethylaminobenzoate, 2-(o-chlorophenyl)-4,5-diphenylimidazolyl dimer, α,α-dialkoxyacetophenones, α-hydroxy alkylphenones, α-aminoalkylphenones, and the like, as well as mixtures thereof.

The amount of the photoinitator, when used in the composition, typically ranges from about 0.01 to about 4% by weight and more typically about 0.1 to about 1% by weight in the composition.

Certain compositions of the present invention contain photoacid generators. Suitable examples of the photoacid generator include onium salts, diazomethane derivatives, glyoxime derivatives, .beta.-ketosulfone derivatives, disulfone derivatives, nitrobenzylsulfonate derivatives, sulfonic acid ester derivatives, and imidoyl sulfonate derivatives.

Illustrative examples of the photoacid generator include:
onium salts such as diphenyliodonium trifluoromethanesulfonate, (p-tert-butoxyphenyl)phenyliodonium trifluoromethanesulfonate, diphenyliodonium p-toluenesulfonate, (p-tert-butoxyphenyl)phenyliodonium p-toluenesulfonate, triphenylsulfonium trifluoromethanesulfonate, (p-tert-butoxyphenyl)diphenylsulfonium trifluoromethanesulfonate, bis(p-tert-butoxyphenyl)phenylsulfonium trifluoromethanesulfonate, tris(p-tert-butoxyphenyl)-sulfonium trifluoromethanesulfonate, triphenylsulfonium p-toluenesulfonate, (p-tert-butoxyphenyl)diphenylsulfonium p-toluenesulfonate, bis(p-tert-butoxyphenyl)phenylsulfonium p-toluenesulfonate, tris(p-tert-butoxyphenyl)sulfonium p-toluenesulfonate, triphenylsulfonium nonafluorobutanesulfonate, triphenylsulfonium butanesulfonate, trimethylsulfonium trifluoromethanesulfonate, trimethylsulfonium p-toluenesulfonate, cyclohexylmethyl(2-oxocyclohexyl)sulfonium trifluoromethanesulfonate, cyclohexylmethyl(2-oxocyclohexyl)sulfonium p-toluenesulfonate, dimethylphenylsulfonium trifluoromethanesulfonate, dimethylphenylsulfonium p-toluenesulfonate, dicyclohexylphenylsulfonium trifluoromethanesulfonate, and dicyclohexylphenylsulfonium p-toluenesulfonate;

diazomethane derivatives such as bis(benzenesulfonyl)diazomethane, bis(p-toluenesulfonyl)diazomethane, bis(xylenesulfonyl)diazomethane, bis(cyclohexylsulfonyl )diazomethane, bis(cyclopentylsulfonyl)diazomethane, bis(n-butylsulfonyl)diazomethane, bis(isobutylsulfonyl)diazomethane, bis(sec-butylsulfonyl)diazomethane, bis (n-propylsulfonyl )diazomethane, bis(isopropylsulfonyl) diazomethane, bis(tert-butylsulfonyl)diazomethane, bis (n-amylsulfonyl)diazomethane, bis(isoamylsulfonyl) diazomethane, bis(sec-amylsulfonyl)diazomethane, bis (tert-amylsulfonyl)diazomethane, 1-cyclohexylsulfonyl-1-(tert-butylsulfonyl)diazomethane, 1-cyclohexylsulfonyl-1-(tert-amylsulfonyl)diazomethane, and 1-tert-amylsulfonyl-1-(tert-butylsulfonyl) diazomethane;

glyoxime derivatives such as bis-o-(p-toluenesulfonyl)-.alpha.-dimethylglyoxime, bis-o-(p-toluenesulfonyl)-.alpha.-diphenylglyoxime, bis-o-(p-toluenesulfonyl)-.alpha.-dicyclohexylglyoxime, bis-o-(p-toluenesulfonyl )-2,3-pentanedioneglyoxime, bis-o-(p-toluenesulfonyl )-2-methyl-3,4-pentanedioneglyoxime, bis-o-(n-butanesulfonyl)-α-dimethylglyoxime, bis-o-(n-butanesulfonyl )-.alpha.-diphenylglyoxime, bis-o-(n-butanesulfonyl)-.alpha.-dicyclohexylglyoxime, bis-o-(n-butanesulfonyl)-2,3-pentanedioneglyoxime, bis-o-(n-butanesulfonyl)-2-methyl-3,4-pentanedioneglyoxime, bis-o-(methanesulfonyl)-.alpha.-dimethylglyoxime, bis-o-(trifluoromethanesulfonyl)-.alpha.-dimethylglyoxime, bis-o-(1,1,1-trifluoroethanesulfonyl)-.alpha.-dimethylglyoxime, bis-o-(tert-butanesulfonyl )-.alpha.-dimethylglyoxime, bis-o-(perfluorooctanesulfonyl)-.alpha.-dimethylglyoxime, bis-o-(cyclohexanesulfonyl)-.alpha.-dimethylglyoxime, bis-o-(benzenesulfonyl)-.alpha.-dimethylglyoxime, bis-o-(p-fluorobenzenesulfonyl)-.alpha.-dimethylglyoxime, bis-o-(p-tert-butylbenzenesulfonyl)-.alpha.-dimethylglyoxime, bis-o-(xylenesulfonyl)-.alpha.-dimethylglyoxime, and bis-o-(camphorsulfonyl)-.alpha.-dimethylglyoxime;

.beta.-ketosulfone derivatives such as 2-cyclohexylcarbonyl-2-(p-toluenesulfonyl)propane and 2-isopropylcarbonyl-2-(p-toluenesulfonyl)propane;

disulfone derivatives such as diphenyl disulfone and dicyclohexyl disulfone;

nitrobenzyl sulfonate derivatives such as 2,6-dinitrobenzyl p-toluenesulfonate and 2,4-dinitrobenzyl p-toluenesulfonate;

sulfonic acid ester derivatives such as 1,2,3-tris(methanesulfonyloxy)benzene, 1,2,3-tris(trifluoromethanesulfonyloxy)benzene, and 1,2,3-tris(p-toluenesulfonyloxy)benzene; and imidoyl sulfonate derivatives such as phthalimidoyl triflate, phthalimidoyl tosylate, 5-norbornene-2,3-dicarboxyimidoyl triflate, 5-norbornene-2,3-dicarboxyimidoyl tosylate, and 5-norbornene-2,3-dicarboxyimidoyl n-butylsulfonate.

The use and development of such photoacid generators is well known to those skilled in the art.

Other compositions according to the present invention can also include one or more components selected from at least one amine modified acrylic oligomer, dyes, adhesion promoters, nonionic surfactants (both fluorinated and non-fluorinated), leveling agents, photosensitizers, solvents and the like. These materials are well known to those of ordinary skill in the art.

Certain compositions of the present invention may also contain as part of the resin binder system, an amine modified acrylic oligomer (also known as acrylated amines) as an auxiliary photopolymerizable compound. Some examples of typical amine modified acrylic oligomers can be represented by, for example, one of the following formulae:

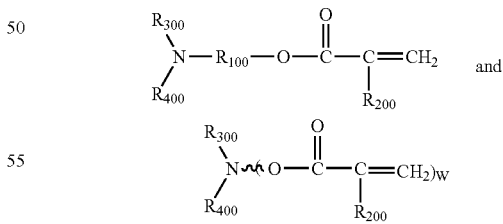

wherein $R_{100}$ is $C_{1-10}$ alkyl, $—(EO)_{aa}—$, $—(PO)_{aa}—$ or

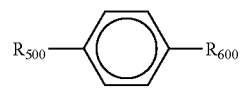

where EO is ethylene oxide, PO is propylene oxide, aa is an integer from 1 to 10, $R_{500}$ and $R_{600}$ each may be the same or different and each independently are $C_{1-10}$ alkyl; $R_{200}$ is hydrogen or $C_{1-6}$ alkyl, and $R_{300}$ and $R_{400}$ each may be the same or different and each independently hydrogen or $C_{1-18}$ alkyl, the alkyl being unsubstituted or substituted with at least one member selected from the group consisting of haloalkyl, $C_{1-4}$ alkoxyl, carboxyl, amino, hydroxyl, aryl, sulfonyl, alkoxycarbonyl, aminocarbonyl; and w is an integer from 1 to 10. The amine acrylic oligomer typically has a molecular weight of about 200 to about 2,000. The amine acrylic oligomer can also contain polyalkylene oxide moieties. Some examples of commercially available amine modified acrylate oligomers include Ebecryl® 81, Ebecryl® 83, Ebecryl® 7100 (UCB Chemicals, Smyrna, Ga.), Laromer® PO 77F (LR 8946), Laromer® PO 94 F (LR 8894), Laromer® LR 8956, Laromer® LR 8996 (BASF, Mt. Olive, N.J.), Actilane 584, Actilane 587, Actilane 595 (Akcros Chemicals, a division of Akzo Nobel Nev.) and CN501, CN502, CN550, CN551, CN371, CN381, CN383, CN384, CN385 (Sartomer Company, Exton, Pa.).

The amine modified acrylic oligomer, when present in the composition, typically ranges from about 0.1 to about 20% by weight and more typically about 0.5 to about 10% by weight.

Examples of solvents include, for example, a glycol ether derivative such as ethyl cellosolve, methyl cellosolve, propylene glycol monomethyl ether, diethylene glycol monomethyl ether, diethylene glycol monoethyl ether, dipropylene glycol dimethyl ether, propylene glycol n-propyl ether, or diethylene glycol dimethyl ether; a glycol ether ester derivative such as ethyl cellosolve acetate, methyl cellosolve acetate, or propylene glycol monomethyl ether acetate; carboxylates such as ethyl acetate, n-butyl acetate and amyl acetate; carboxylates of di-basic acids such as diethyloxylate and diethylmalonate; dicarboxylates of glycols such as ethylene glycol diacetate and propylene glycol diacetate; and hydroxy carboxylates such as methyl lactate, ethyl lactate, ethyl glycolate, and ethyl-3-hydroxy propionate; a ketone ester such as methyl pyruvate or ethyl pyruvate; an alkoxycarboxylic acid ester such as methyl 3-methoxypropionate, ethyl 3-ethoxypropionate, ethyl 2-hydroxy-2-methylpropionate, or methylethoxypropionate; a ketone derivative such as methyl ethyl ketone, acetyl acetone, cyclopentanone, cyclohexanone or 2-heptanone; a ketone ether derivative such as diacetone alcohol methyl ether; a ketone alcohol derivative such as acetol or diacetone alcohol; lactones such as butyrolactone; an amide derivative such as dimethylacetamide or dimethylformamide, anisole, and mixtures thereof. The amount of solvent(s), when present in the composition, typically ranges from about 30 to about 80% by weight.

Another component of the negative photoresist composition is an inorganic particle material. Suitable inorganic particle materials which can be used include metals, metal salts, metallic oxides, and combinations thereof. Suitable metals those in Groups VIB, VIIB, VIIIB, IB, IIB, IIA, IVA, VA, VIA and combinations thereof. Suitable examples of metals include titanium, vanadium, cobalt, hafnium, boron, gold, silver, silicon, aluminum, copper, zinc, gallium, magnesium, indium, nickel, germanium, tin, molybdenum, niobium, zirconium, platinum, palladium, antimony, and combinations thereof. Suitable examples of metal salts include halides, carbides and nitrides, such as silicon carbide, silicon nitride and combinations thereof. Examples of metallic oxides include those available from the Groups mentioned above and combinations thereof. Suitable examples include magnesium oxide, iron (III) oxide, aluminum oxide, chromium oxide, zinc oxide, titanium dioxide, silicon dioxide and combinations thereof. In general, the average particle size (diameter) of the inorganic particle is between about 1 and 100 nm, further between about 10 and about 50 nm, and further between about 20 and about 50 nm.

Typically the percentage content of the inorganic particle material is between about 0.1% and about 90% by weight of the photosensitive resist composition; further between about 5% and about 75% and further between about 10% and about 50% by weight.

In useful embodiments, when the inorganic particle material is added to a photoresist composition, it has been unexpectedly discovered that the combination of the inorganic particle material and resin binder allows for the formation of thick photoresist films.

Typically, the thickness of the photoresist composition containing inorganic particle material on a substrate is between about 10 to about 150 μm, further between about 10 and about 100 μm, and even further between about 20 μm and 80 μm.

For example, colloidal silica ($SiO_2$) can be prepared in 1 to 100 nm diameter particles, and is commercially available as 8–10 nm, 10–15 nm, 10–20 nm, 17–23 nm, and 40–50 nm particles. Such colloidal silicas are available from, for example, Nissan Chemicals. In some instances, the colloidal silicas are supplied in various solvents which are not very useful in the photoresist area. In most instances, it is beneficial to disperse the colloidal silica in a solvent which is useful, for example, propylene glycol mono-methyl ether.

The prepared photoresist composition solution can be applied to a substrate by any conventional method used in the photoresist art, including dipping, spraying, whirling and spin coating. When spin coating, for example, the resist solution can be adjusted with respect to the percentage of solids content, in order to provide coating of the desired thickness, given the type of spinning equipment utilized and the amount of time allowed for the spinning process. Suitable substrates include but not limited to such metals as tungsten, gold, copper, titanium, platinum and nickel. The photoresist may also be coated over an antireflective coating.

The photoresist composition solution is then coated onto the substrate, and the substrate is treated at a temperature from about 50° C. to about 200° C. for from about 30 seconds to about 600 seconds (or even longer) on a hot plate or for from about 15 to about 90 minutes (or even longer) in a convection oven. This temperature treatment is selected in order to reduce the concentration of residual solvents in the photoresist, while not causing substantial thermal degradation of the solid components. In general, one desires to minimize the concentration of solvents and the above temperature treatment is conducted until substantially all of the solvents have evaporated and a coating of photoresist composition, on the order of about 10 to 125 microns in thickness, remains on the substrate. In a preferred embodiment the temperature is from about 95° C. to about 120° C. The treatment is conducted until the rate of change of solvent removal becomes relatively insignificant. The temperature and time selection depends on the photoresist properties desired by the user, as well as the equipment used and commercially desired coating times. The coating substrate can then be image-wise exposed to actinic radiation, e.g. ultraviolet radiation, at a wavelength of from about 157 nm to about 500 nm, X-ray, electron beam, ion beam or laser radiation, as well as other sub-200 nm wavelengths, in any desired pattern, produced by use of suitable masks, negatives, stencils, templates, etc. Generally, thick photoresist films are exposed using broadband radiation, using equipments such as Ultratech, Karl Süss or Perkin Elmer broadband exposure tools, although 436 nm, 365 nm, and 248 nm Steppers may also be used.

The photoresist can optionally be subjected to a post exposure second baking or heat treatment before development. The heating temperatures may range from about 90° C. to about 150° C., and more preferably from about 100° C. to about 130° C. The heating may be conducted for from about 30 seconds to about 2 minutes, and more preferably from about 60 seconds to about 90 seconds on a hot plate or about 30 to about 45 minutes by convection oven.

The exposed photoresist-coated substrates are developed to remove the unexposed areas by immersion in a developing solution or developed by spray development process. The solution is preferably agitated, for example, by nitrogen burst agitation. The substrates are allowed to remain in the developer until all of the photoresist coating has dissolved from the unexposed areas. Developers include aqueous solutions of ammonium or alkali metal hydroxides. One preferred aqueous developer is an aqueous solution of tetramethyl ammonium hydroxide. Other developers include solvent based developers. After removal of the patterned substrate from the developing solution, one may conduct an optional post-development heat treatment or bake to increase the coating's adhesion and chemical resistance to post imaging processing. The post-development heat treatment can comprise hot plate or oven baking of the coating and substrate below the coating's softening point or UV hardening process.

The following examples provide illustrations of the methods of producing and utilizing compositions of the present invention. These examples are not intended, however, to limit or restrict the scope of the invention in any way and should not be construed as providing conditions, parameters or values which must be utilized exclusively in order to practice the present invention. Unless otherwise specified, all parts and percents are by weight.

1A) Preparation of Colloidal Silica Dispersed in Propylene Glycol Mono-methyl Ether (PGME-CS1)

Dispersions of silica nanoparticles in PGME were prepared by solvent displacement from NPC-ST-30 (silica nanoparticles in ethylene glycol mono-n-propyl ether, 10–15 nm in diameter, manufactured by Nissan Chemical, a solid matter content of silica of 30% by weight). The solvent, ethylene glycol mono-n-propyl ether was removed by distillation under vacuum. Colloidal silica was redispersed in PGME (PGME-CS1) by ultrasonicating for 2 hours and the solid content was 26.2% by weight.

1B) Preparation of Colloidal Silica Dispersed in Propylene Glycol Mono-methyl Ether (PGME-CS2)

Dispersions of silica nanoparticles in PGME were prepared by solvent displacement from IPA-ST-L (silica nanoparticles in isopropanol, 40–50 nm in diameter, manufactured by Nissan Chemical, a solid matter content of silica of 30% by weight). The solvent, isopropanol, was removed by distillation under vacuum. Colloidal silica was redispersed in PGME (PGME-CS2) by ultrasonicating for 2 hours and the solid content was 30% by weight.

2) Negative Nanocomposite Resists 2-1. A. Preparation of Negative Nanocomposite Resists Containing PGME-CS1

3.97 g of PGME-CS1 was added into 10 g of AZ 100nXT (from AZ Electronic Materials USA Corp., polymer resin in propylene glycol mono-methyl ether acetate and PGME with a solid content 59% by weight). The solution was rolled overnight at room temperature and used without filtration. The solution was transparent and the silica content was 15% by weight (solid matter base). The solvent content in the nanocomposite resist was 50.3% by weight. The nanocomposite resist with high viscosity is suitable for thick film application. The silica nanoparticles were incorporated into the polymer matrices homogeneously without agglomeration. No precipitation was observed after 2 months.

2-1B. Preparation of Negative Nanocomposite Resists Containing PGME-CS2

3.43 g of PGME-CS2 was added into 10 g of AZ 100nXT (from AZ Electronic Materials USA Corp., polymer resin in propylene glycol mono-methyl ether acetate and PGME with a solid content 59% by weight). The solution was rolled overnight at room temperature and used without filtration. The solution was transparent and the silica content was 15% by weight (solid matter base). The solvent content in the nanocomposite resist was 48.4% by weight. The nanocomposite resist with high viscosity is suitable for thick film application. The silica nanoparticles were incorporated into the polymer matrices homogeneously without agglomeration. No precipitation was observed after 2 months.

2-1C. Preparation of Negative Nanocomposite Resists Containing PGME-CS1

3.97 g of PGME-CS1 can be added into 10 g of AZ N6070 (from AZ Electronic Materials USA Corp.) or into 10 g of AZ nLOF 2000 in the manner as described in 2-1A above. The lithographic performance of these compositions is expected to be equal to that described below.

2-1D. Preparation of Negative Nanocomposite Resists Containing PGME-CS2

3.43 g of PGME-CS1 can be added into 10 g of AZ N6070 (from AZ Electronic Materials USA Corp.) or into 10 g of AZ nLOF 2000 in the manner as described in 2-1B above. The lithographic performance of these compositions is expected to be equal to that described below.

2-2. Lithographic Performance

The photoresist solution from 2-1A. was coated onto 6 inch silicon wafers and baked at 110° C. for 4 minutes to give a coating of 20–40 µm. The wafers were exposed on a Karl Suss broadband exposure tool developed immediately after exposure using AZ 300 MIF with 3 puddles of 60 second each. The developed resists showed good resolution, clean development and straight profile.

The photoresist solution from 2-1B. was coated onto 6 inch silicon wafers and baked at 110° C. for 4 minutes to give a coating of 20–40 µm. The wafers were exposed on a Karl Suss broadband exposure tool developed immediately after exposure using AZ 300 MIF with 2 puddles of 60 second each. The developed resists showed good resolution, clean development and straight profile.

The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

We claim:

1. A photoresist composition suitable for image-wise exposure and development comprising a negative photoresist composition, wherein the negative photoresist composition comprises (i) a photopolymerizable compound containing at least two pendant unsaturated groups; (ii) ethylenically unsaturated photopolymerizable polyalkylene oxide hydrophilic compound(s); (iii) a photoinitiator and an amine modified acrylic oligomer, and an inorganic particle material having an average particle size equal or greater than 10 nanometers, wherein the photoresist composition is capable of forming a photoresist coating film with a thickness greater than 5 microns after exposure and development.

2. The photoresist composition according to claim 1 wherein the photoresist coating film thickness is greater than 10 microns.

3. The photoresist composition according to claim 1, where the photoresist coating film thickness is greater than 20 microns.

4. The photoresist composition according to claim 1, where the photoresist coating film thickness is less than 150 microns.

5. The photoresist composition according to claim 1, where the inorganic particle material is colloidal silica.

6. The photoresist composition according to claim 1, where the inorganic particle material has an average particle size from greater than about 10 to about 50 nanometers.

7. The photoresist composition according to claim 1, where the inorganic particle material has an average particle size from about 20 to about 50 nanometers.

8. The photoresist composition according to claim 1, where the inorganic particle material is present in an amount of from about 0.1% and about 90% by weight of the photoresist.

9. The photoresist composition according to claim 1, where the inorganic particle material is present in an amount of from about 5% and about 75% by weight of the photoresist.

10. The photoresist composition according to claim 1, where the inorganic particle material is present in an amount of from about 10% and about 50% by weight of the photoresist.

* * * * *